United States Patent
Conta et al.

(10) Patent No.: US 8,013,684 B2
(45) Date of Patent: Sep. 6, 2011

(54) RADIO FREQUENCY NOISE AND INTERFERENCE SUPPRESSION IN AN INTEGRATED CIRCUIT

(75) Inventors: Matteo Conta, Irvine, CA (US); Andrea Baschirotto, Tortona (IT)

(73) Assignee: ST-Ericsson SA, Geneva (CH)

( * ) Notice: Subject to any disclaimer, the term of this patent is extended or adjusted under 35 U.S.C. 154(b) by 396 days.

(21) Appl. No.: 12/204,546

(22) Filed: Sep. 4, 2008

(65) Prior Publication Data

US 2009/0243754 A1 Oct. 1, 2009

(30) Foreign Application Priority Data

Apr. 1, 2008 (WO) .................. PCT/IT2008/000218

(51) Int. Cl.
*H04B 3/30* (2006.01)
*H03H 7/00* (2006.01)
(52) U.S. Cl. ............................ 333/12; 333/167; 333/172
(58) Field of Classification Search ................... 333/12, 333/167, 168, 172; 307/30, 147; 257/202, 257/503; 327/565
See application file for complete search history.

(56) References Cited

U.S. PATENT DOCUMENTS

| | | | |
|---|---|---|---|
| 6,657,318 B2 * | 12/2003 | Ishikawa et al. ............... 307/30 |
| 6,657,484 B1 | 12/2003 | Bosshart | |
| 6,680,533 B1 | 1/2004 | Miyazawa | |
| 7,019,562 B1 | 3/2006 | Ferris | |
| 2002/0014915 A1 | 2/2002 | Ishikawa | |
| 2004/0064747 A1 | 4/2004 | Haider | |
| 2004/0212039 A1 | 10/2004 | Yamamoto | |
| 2005/0030686 A1 | 2/2005 | Dickmann | |
| 2005/0063134 A1 | 3/2005 | Kim et al. | |
| 2006/0092675 A1 | 5/2006 | Kajita | |

OTHER PUBLICATIONS

Invitation to Pay Additional Fees and, Where Applicable, Protest Fee, PCT/IT2008/000218, Jul. 7, 2009.
International Search Report and Written Opinion of the International Searching Authority, PCT/IT2008/000218, Oct. 26, 2009.

* cited by examiner

*Primary Examiner* — Robert Pascal
*Assistant Examiner* — Kimberly E Glenn
(74) *Attorney, Agent, or Firm* — Coats & Bennett, P.L.L.C.

(57) ABSTRACT

In an integrated circuit having a number of circuit units on a single semiconductor chip, particularly in a system-on-chip integrated circuit including an integrated transceiver, interference between the circuit units is suppressed using on-chip resonant elements. Each resonant element has at least one on-chip capacitor and at least one on-chip conductive line constituting an inductance. The capacitance-inductance combinations are arranged to be resonant at one or more frequencies at which radio frequency energy is generated by the circuit units. The capacitive part of each series resonant combination is formed as a plurality of capacitor elements forming in an array to minimise self-inductance. Also disclosed is a filtering arrangement in which each circuit unit is individually supplied from the tap of a series resistive-capacitance combination to provide low-pass filtering. The resistance of such a combination may be configured as an FET to allow the circuit unit to be individually powered down to a low leakage state.

19 Claims, 5 Drawing Sheets

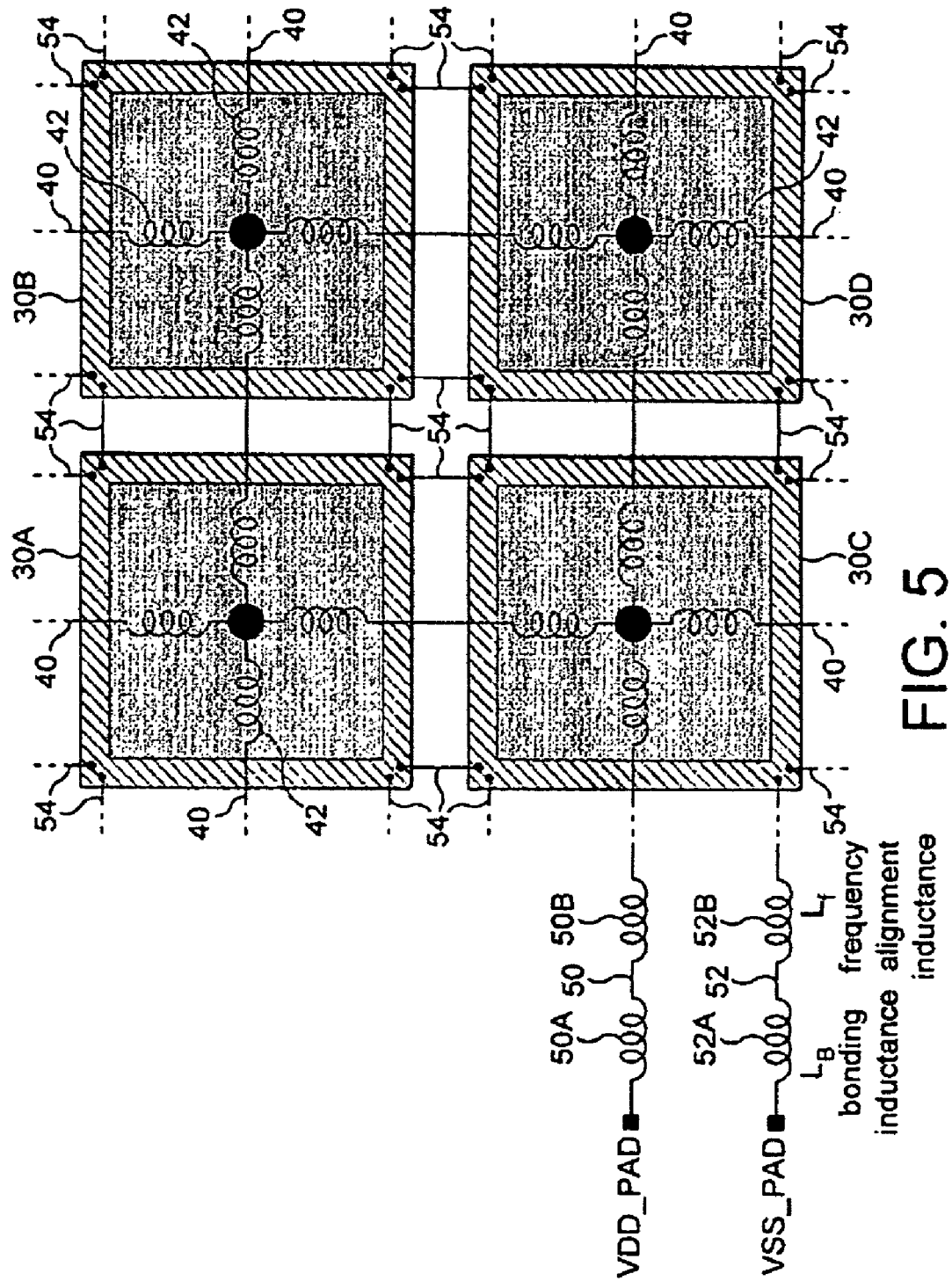

RADIO FREQUENCY NOISE AND INTERFERENCE SUPPRESSION IN AN INTEGRATED CIRCUIT

CROSS REFERENCE TO RELATED APPLICATIONS

The present application claims priority under 35 U.S.C. §119 (a)-(d) to Application No. PCT/IT2008/000218 filed on Apr. 1, 2008, the entire contents of which are incorporated herein by reference.

FIELD OF THE INVENTION

This invention relates to an integrated circuit comprising a plurality of circuit units on a single semiconductor chip, at least some of which units are operable at radio frequencies.

BACKGROUND TO THE INVENTION

A particular problem with a typical integrated circuit comprising a plurality of circuit units including radio frequency units is the reduction of noise transmitted along power supply lines between the circuit units. For instance, digital circuit units generate noise signals that can seriously impair the performance of high-sensitivity units such as RF front end circuit units. This problem is prevalent in so-called System-on-Chip devices such as telecom transceivers. In a System-on-Chip transceiver, the RF circuit units may be subject to interference from digital circuit units, the interfering signals being transmitted on a supply line and through the substrate.

One known solution is to construct the RF circuits as fully differential circuits, which has the effect of reducing substrate and common-mode noise. In addition, driving the supply lines from a voltage regulator reduces supply noise. However, the latter solution is only partially effective for RF front-end circuit units since noise suppression using a voltage regulator tends to be confined within a frequency range of between, typically, 100 kHz and 1 MHz. Above 1 MHz, noise suppression tails off.

Fully differential circuits can extend the noise suppression frequency range according to the effective range of their common-mode control systems which are dependent on the frequency range of the common-mode control feedback in such systems. The effective bandwidth of a common-mode control circuit is typically slightly lower than its complete signal bandwidth. As a consequence, at the upper operating frequencies, interference still occurs as a result of supply line transmission.

It is an object of the invention to provide improved interference suppression in an integrated circuit having radio frequency circuit units.

SUMMARY OF THE INVENTION

According to one aspect of this invention, an integrated circuit comprises a plurality of circuit units on a single semiconductor chip, at least some of which units are operable at radio frequencies, wherein the chip includes a plurality of resonant elements interconnecting supply lines on the chip, each resonant element comprising a series combination of at least one on-chip capacitor and at least one on-chip conductive line constituting an inductance, the combination having a series resonance at a frequency at which at least one of the circuit units processes radio frequency signals. At the resonant frequency, the impedance between the supply lines in the vicinity of the resonant elements is at a minimum and the component of supply line noise at that frequency is suppressed, thereby reducing-interference between the circuit units.

In a preferred embodiment of the invention, the resonant series combination comprises a plurality of capacitors located side-by-side on the chip and connected to each other in parallel, the interconnections between the capacitors forming at least part of the inductance. Typically, the series combination comprises at least four capacitors that form an array having rows and columns, each row and each column having at least two capacitors.

Depending on the type of semiconductor chip, capacitance per unit area of the chip may be maximised by arranging for the capacitors to be constructed as parallel-connected pairs of stacked parallel-connected capacitors. Accordingly, the series combination may comprise at least one pair of capacitors which are connected in parallel and are stacked one on top of the other, one capacitor being a metal-insulator-metal capacitor (MiMCAP) and the other being a metal-oxide-silicon capacitor (MOSCAP). The MOSCAP is located directly underneath the MIMCAP of the pair.

The inductive part of the or each resonant element may be constituted by or include at least one conductive line on the chip, for instance a conductive line connecting the capacitor or capacitors to one of the supply lines. In the case of the capacitors being located side by side or in an array, the inductance may include conductive lines interconnecting the capacitors.

It is also possible for the inductive part of the resonant element to be formed by one or more lumped inductances.

In the case of the capacitive part being an array of capacitors, the interconnections between the capacitors may form a grid of inductive lines forming part of the inductance of the series resonant combination.

Typically, the resonant frequency of the series combination is at least 1 GHz, i.e., in the frequency range where other techniques are not effective. The total capacitance of each resonant element is typically in the range of from 10 pF to 1000 pF, with each component capacitor of the array having a capacitance in the range of from 1 pF to 10 pF.

The resonant elements may be placed and connected close to each of a number of supply pads on the chip so that notch filtering is concentrated at the supply pads. Alternatively, the resonant elements can be distributed within the chip, e.g. by connecting them to supply line tracks interconnecting circuit units likely to interfere with each other. Accordingly, where the supply lines of the chip are arranged such that a first one of the circuit unit receives supply current from supply line which has a second one of the circuit units connected to it between the first circuit unit and a power source terminal which is for supplying power to the supply line, one of the resonant elements may be connected to the supply line at a node on that portion of the supply line that interconnects the first and second units. This resonant element may be resonant at a frequency of operation of the first or the second circuit unit to act as a guard element suppressing the transmission of radio frequency energy at that frequency between the first and second units along the supply line. What is more, where the integrated circuit includes a third one of the circuit units connected to the same supply line, and connections of the third circuit unit to the supply line are arranged such that both the second and the first units are connected to the supply line between the third unit and the power source terminal, a second resonant element may be connected to the supply line at a node on that portion of the supply line interconnecting the third unit and the first unit. This second resonant element may be resonant at a frequency of operation of the first circuit unit or the third circuit unit to act as a second guard element. The second guard element operates to suppress the transmission of radio frequency energy at that frequency between the first and third units along the supply line.

As a further measure for reducing the transmission of interfering signals between circuit units and the chip, at least one of the circuit units operable at radio frequencies is coupled to one of the supply lines via a respective on-chip resistive element forming part of a resistor-capacitor (PC) network such that the supply current drawn by the or each such circuit unit passes through the resistive element. In this case, the supply line itself, together with circuitry other than that one circuit unit coupled to the supply line, has an associated capacitance forming part of the RC network to define a low-pass filter having a cut-off frequency above the frequency at which the respective circuit unit chiefly emits radio frequency energy so as to isolate the circuitry coupled to the supply line from the emitting circuit unit.

With regard to the suppression of interference entering the circuit unit connected to the supply line by the respective on-chip resistive element, the capacitance of the relevant RC network is the capacitance of the circuit unit itself and any additional capacitance added to tailor the frequency response of the RC network.

The resistive element may comprise a field-effect transistor, such as a PMOS transistor, connected so as to be biased into its triode region of operation.

According to a second aspect of the invention, an integrated circuit comprises a plurality of circuit units on a single semiconductor chip, at least some of which units are operable at radio frequencies, the chip further comprising a supply line for supplying power to the said circuit units, wherein at least a first one of the circuit units operates so as to emit radio frequency energy and is coupled to the supply line via a respective on-chip resistive elements forming part of an RC network such that supply current drawn by the first circuit unit passes through the said resistive element, and wherein the supply line itself, together with circuitry other than the said first circuit unit coupled to the supply line, has an associated capacitance forming part of the RC network to define a low-pass filter having a cut-off frequency above the frequency at which the first unit chiefly emits radio frequency energy so as to isolate the circuitry coupled to the supply line from the first circuit unit.

According to a third aspect of the invention, an integrated circuit comprises a plurality of circuit units on a single semiconductor chip, at least some of which units operate at radio frequencies and are coupled to a supply line, wherein the chip includes (i) coupled to the supply line, at least one resonant element comprising a series combination of an inductance and a capacitance having a series resonant frequency corresponding to a frequency of operation of at least one of the circuit units that operate at radio frequencies; (ii) at least one RC network including a resistive element connected in series between the supply line and a respective said circuit unit; and (iii) a supply line voltage regulator.

The invention is particularly applicable to an integrated circuit that comprises an integrated transceiver.

The invention will be described below by way of example only with reference to the drawings.

BRIEF DESCRIPTION OF THE DRAWINGS

In the drawings:

FIG. 5 is a plane view of an array of on-chip capacitors;

DETAILED DESCRIPTION OF THE PREFERRED EMBODIMENTS OF THE INVENTION

Figure 1:
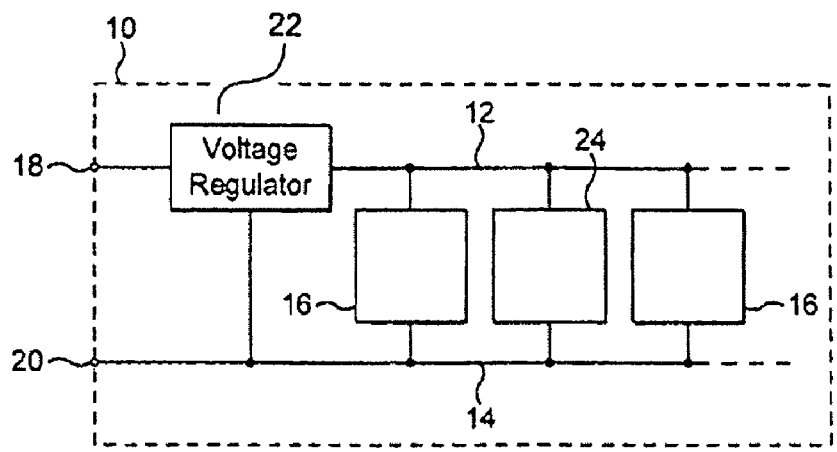
FIG. 1 is a block diagram illustrating the principle of the invention.

Referring to FIG. 1, an integrated circuit 10 in accordance with the invention has on-chip supply lines 12 and 14 of opposite polarity and, connected to and powered from these supply lines 12 and 14, at least one circuit unit 16. Power is supplied to the supply lines 12 and 14 via two power source terminals 18 and 20, the chip including a voltage regulator 22 connected between one of the power source terminals 18 and one of the supply lines 12. One of the supply lines 14 may be formed as a ground plane.

Figure 2:
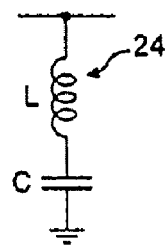
FIG. 2 is a circuit diagram of a simple notch filter.
Figure 3:
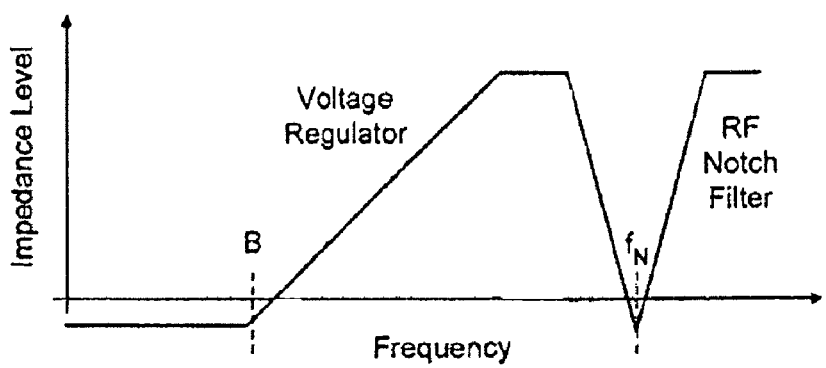
FIG. 3 is a diagrammatic frequency response.

In accordance with the invention, a radio frequency (RF) notch filter 24 is also connected between the supply lines 12 and 14. Referring to FIG. 2, in its simplest form, the notch filter comprises the series combination of an on-chip inductance (L) and an on-chip capacitance (C). This series-resonant element introduces a notch in the inter-supply line impedance at a frequency $f_N$, as shown in FIG. 3. $f_N$ is given by:

$$f_N = 1/(2\pi\sqrt{LC})$$

where L and C are the inductance and capacitance, respectively, of the notch filter 24.

The effect of the voltage regulator 22, in addition to regulating the supply line voltage is to suppress noise entering the integrated circuit via the power source terminal 18 as well as noise picked up by the supply lines themselves.

The extent to which supply line noise is suppressed by the voltage regulator depends on the noise frequency spectrum. As shown in FIG. 3, which is a representation of the impedance between the supply lines 12 and 14 at different frequencies, the voltage regulator exhibits a low impedance at low frequencies. Above a frequency B, the impedance represented by the voltage regulator rises. Therefore, noise components at frequencies higher than B are suppressed by the voltage regulator to a lesser degree, the higher the frequency. Typically, the voltage regulator is effective to suppress noise within a frequency band up to 1 MHz.

The effect of the notch filter 24 is to suppress supply line noise within a comparatively narrow frequency band centred on the resonant frequency $f_N$ of the notch filter, $f_N$ being much higher than the frequency of the highest frequency components suppressed by the voltage regulator 22 (as shown in FIG. 3). Noise suppression at and around frequency $f_N$ is achieved efficiently, since the notch filter is almost entirely reactive.

The component values of the notch filter 24 are selected such that the frequency of resonance is the frequency of the signals processed by the circuit units 16. In the present instance, the integrated circuit is a GPS receiver circuit and the resonant frequency is 1.571 GHz.

Accordingly, in the case of the integrated circuit being an RF transceiver, filter 24 may be tuned to the normal frequency of transmission. Alternatively, the notch filter may be tuned to the frequency of a local oscillator, a harmonic of one of those frequencies or to a radio frequency emission of logic circuitry in one or more of the circuit units 16.

The on-chip implementation of the notch filter depends on the frequency or frequencies at which noise or interference signals are to be suppressed, on the semiconductor technology of the chip, and on available space. Typically, in radio frequency system-on-chip integrated circuits for mobile telephony, the most serious RF noise signals have frequency components at 800 MHz or more. In general, integrated circuits in accordance with the invention have notch filters which are most effective within the frequency range of from 500 MHz to 10 GHz. It will be understood that, the higher the required frequency of resonance, the greater is the significance of the self-inductance of on-chip interconnections, particularly the connections between the capacitance and the supply lines. Accordingly, the inductance L of the series resonant network shown in FIG. 2 may be constituted entirely by one or more such interconnections, i.e. without any lumped inductor element. Alternatively, inductance L may incorporate a plurality of lumped inductor elements.

Figure 4:
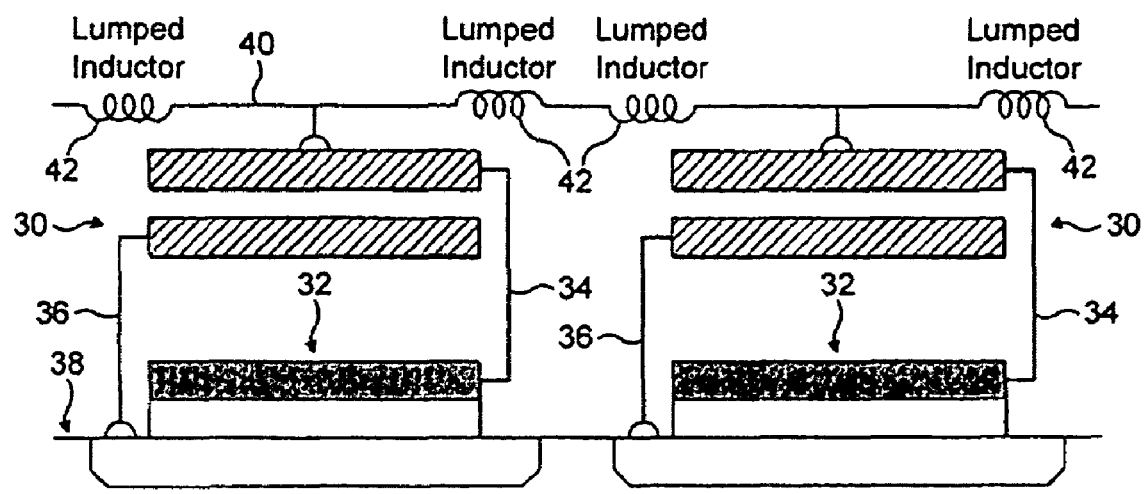
FIG. 4 is a diagrammatic cross-section of pairs of on-chip capacitors.

In a preferred embodiment of the invention, the capacitance C is maximized by forming the capacitance as pairs of capacitors stacked one on top of the other, as shown in FIG. 4. In this structure the capacitance C of the notch filter 24 has two such pairs of capacitors, each pair being realized as the parallel combination of a metal insulator metal capacitor (MiMCAP) 30 and a metal-oxide-silicon capacitor (MOSCAP) 32. Such a structure can be realized in several integrated circuit technologies. The MOSCAPs 32 can be formed so as to yield at least 5 fF per square micron, while MiMCAPs yield in the region of 2 fF per square micron.

Each capacitor 30 and 32 has an upper plate and a lower plate and, within each stacked pair 30 and 32, the upper plates are interconnected by a via 34 and the lower plates are interconnected by a via 36, the lower plates in this case being formed in a substrate layer 38. The substrate layer 38 also serves as part of the parallel interconnection of the two capacitor pairs 30 and 32, the other part of the parallel interconnection being performed between the respective upper plates by a metal track 40 which may include lumped inductors 42, as shown.

In integrated circuit technologies where MOSCAPs cannot be formed, the notch filter capacitance may be formed as a plurality of MiMCAPS arranged side by side. Whether or not the MOSCAPs are used the use of a plurality of on-chip capacitor elements connected in parallel to form the capacitive part of the notch filter has the advantage that unwanted inductances within the capacitor plates themselves are negligible.

As mentioned above, the interconnections of the notch filter may, by themselves, have sufficient inductance to yield a required resonant frequency, the combination of the capacitors 30 and 32 and their interconnections, as well as the connections to the supply lines defining a self-resonant frequency (SRF). Whether or not stacked capacitors are used, as described above with reference to FIG. 4, the capacitance C of the notch filter may be formed as an array of capacitors 30A, 30B, 30C and 30D, as shown in FIG. 5. The array has many capacitors, of which only four MiMCAPs appear in FIG. 5. It will be understood that MOSCAPs may or may not be performed beneath the MiMCAPS 30A-30D in registry with the latter, according to the construction described above with reference to FIG. 4.

Referring to FIG. 5, the capacitors 30A-30D are all connected in parallel between supply line pads VDD_PAD and VSS_PAD by primary conductor lines 50 and 52 which each incorporate bonding inductances 50A and 52A having an inductance $L_B$ and lumped frequency alignment inductances 50B and 52B having an inductance $L_f$. Interconnections B between the top plates of the capacitors 30A-30D are by way of conductor lines 40 incorporating inductances 42, the conductor lines 40 forming a grid. The lower plates of the capacitors are interconnected by links 54 between their corners.

The total capacitance C of a filter formed in this way is the sum of the individual capacitances of the capacitors 30A-30D. With regard to the total inductance, this is given by $L=L_d+L_f+L_B$ where $L_d$ is the distributed inductance contributed by the lumped and/or parasitic/inherent inductances of the interconnections between the capacitor plates. Accordingly, the resonant frequency of the filter is given by:

$$f_N = \frac{1}{2\pi\sqrt{(L_d + L_f + L_B) \cdot C}}$$

The frequency alignment inductance $L_f$ is a lumped inductance added to achieve a required resonant frequency $f_N$ where the self inductance of the interconnection's between the capacitors and the bonding inductances is insufficient.

In practice, an integrated circuit in accordance with the invention may have several notch filters constructed as described above. They may be placed in a concentrated manner or they may be distributed, as will be described below.

In a concentrated placement, the integrated circuit has one such notch filter per supply pad, the filter being connected close to the pad in order to suppress noise on the supply lines.

In a distributed arrangement, the notch filters are placed between different circuit units in order to suppress noise signals at or around $f_N$ in a portion of the supply line interconnecting neighbouring circuit units. This suppresses noise signals locally in specific parts of the chip to prevent RF emissions of one circuit unit interfering with the operation of a unit close by, such interfering signals travelling between the units along the common supply line portion.

Figure 6:
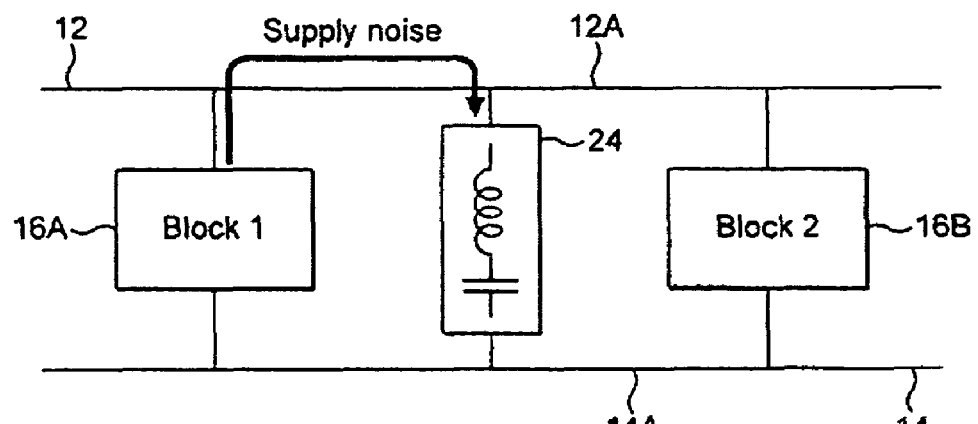
FIG. 6 is a block diagram of part of an integrated circuit incorporating inter-unit shielding.

The action of a notch filter locally placed in this manner is shown in FIG. 6. A first circuit unit 16A produces an RF noise signal which is injected onto the supply line 12 where it is apparent as supply noise. A second circuit unit 16B is sensitive to interference by supply noise at the frequency at which it is generated by circuit unit 16A. To prevent such interference, a notch filter 24 tuned to that frequency is connected to the supply lines 12 and 14 at a location between the first and second circuit units 16A and 16B, specifically between the supply line portions 12A and 14A interconnecting the first and second circuit units 16A and 16B. This provides a local low impedance path between such supply line portions 12A and 14A to prevent transmission of the supply noise from the first unit 16A to the second unit 16B.

As an extension of the concept of inter-unit filtering, advantages can be obtained by forming a loop of such filters around the most critical circuit units of the integrated circuit in order to improve the efficiency of isolation from interfering signals.

Figure 7:
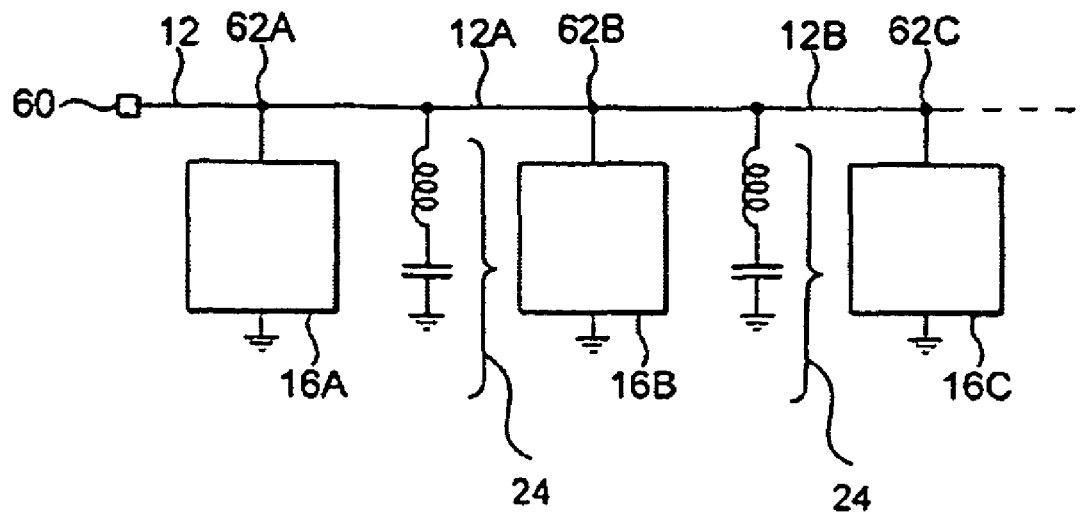
FIG. 7 is a block diagram of another integrated circuit incorporating inter-block shielding.

Referring to FIG. 7, in another arrangement in accordance with the invention, the integrated circuit has at least three circuit units 16A, 16B and 16C connected to a common supply line 12 which, in turn, is powered from a power source terminal 60, the circuit units 16A-16C being connected in a serial chain to the supply line 12, i.e. one after the other on the common line. To suppress interference between the three circuit units 16A-16C, notch filters 24, comprising series-resonant inductance-capacitance combinations, are connected to those portions 12A and 12B of the supply line 12 interconnecting the supply connection nodes 62A, 62B and 62C of the individual circuit units 16A, 16B and 16C. The resonant frequencies of the notch filters 24 may be different. For example, although it is possible for both notch filters to be resonant at the frequency of operation of the first circuit unit 16A, it is possible for the filter 24 coupled to the first interconnecting supply line portion 12A to be resonant at the frequency of operation of the second circuit unit 16B, while the resonant frequency of the filter 24 connected to the second interconnecting supply line portion 12B may be resonant at the frequency of operation of any of the circuit units 16A-16D.

In the arrangements described above with reference to FIGS. 6 and 7, the locally placed notch filters 24 act as guard elements between respective circuit units suppressing the transmission of interfering radio frequency energy between the units along the supply line interconnecting them. Other arrangements of guard elements will be apparent to the skilled man.

As a further means of preventing interference between respective circuit units of an integrated circuit, medium frequency shielding may be introduced as will now be described with reference to FIGS. 8 and 9.

Figure 8:
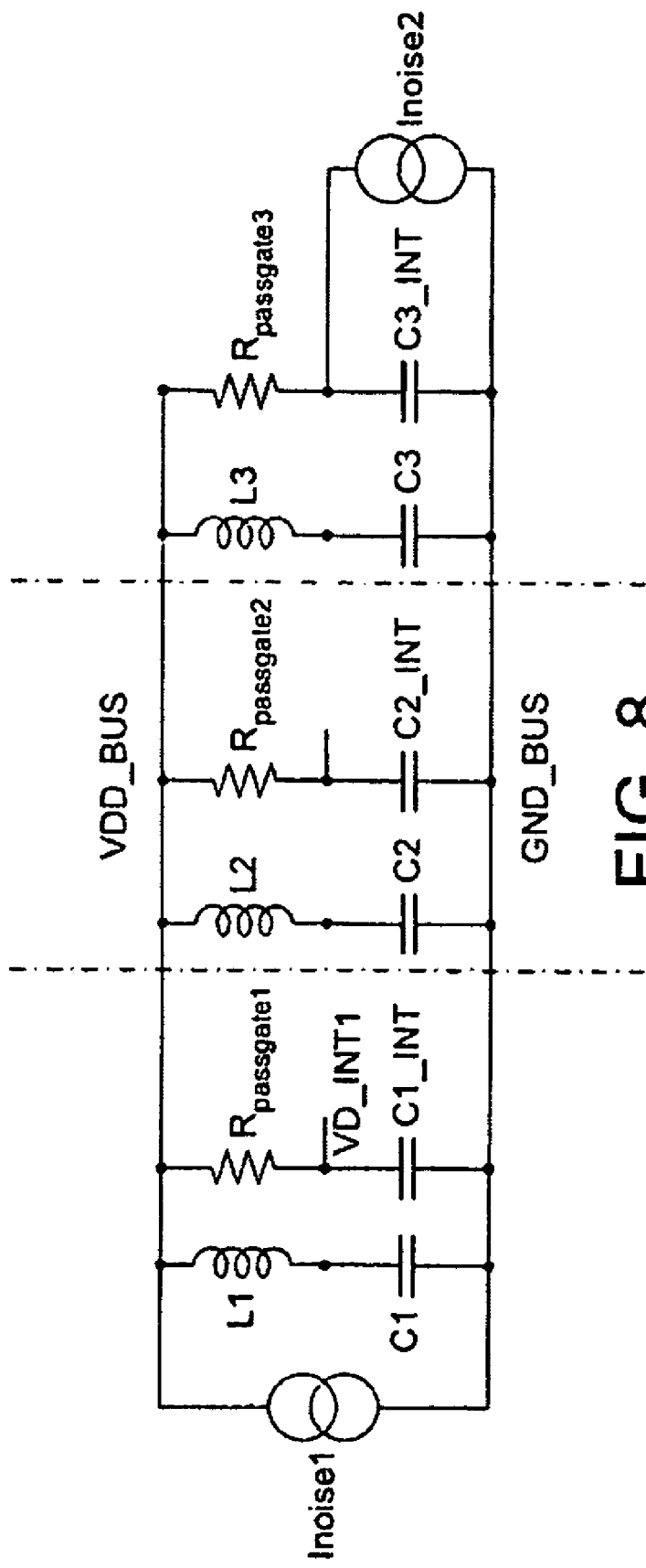
FIG. 8 is a simplified circuit diagram of a plurality of on-chip filtering networks incorporating LC elements and RC elements.

Referring to FIG. 8, in yet a further integrated circuit in accordance with the invention, a number of supply line noise suppression networks are included. These networks include series resonant elements 24 such as those described above, here shown as locally placed series combinations of inductances and capacitances L1, C1, L2, C2 and L3, C3, each being placed adjacent a respective circuit unit (not shown). In this embodiment, additional filtering is provided by supplying each respective circuit unit from the tap of a series-connected resistive-capacitance combination coupled across the supply lines 12 and 14. Three such combinations are shown in FIG. 8. Each comprises a pass-gate resistance $R_{passgate1}$, $R_{passgate2}$, $R_{passgate3}$, and a capacitance C1_INT C2_INT, C3_INT, each of which is the sum of the inherent capacitance $C_{act}$ of the circuit unit connected to the tap VDD_INT1, VDD_INT2, VDD_INT3 and a capacitance added for filtering purposes ($C_{filt}$). Each resistance-capacitance combination comprises a low pass filter allowing the passage of supply current to the respective circuit unit connected to the tap while suppressing noise signals above a threshold frequency. Beyond the threshold frequency, the suppression of noise tails off owing to inherent inductance in the network, suppression above that frequency being performed, instead, by the series-resonant elements L1, C1; L2, C2; L3 and C3.

Figure 9:
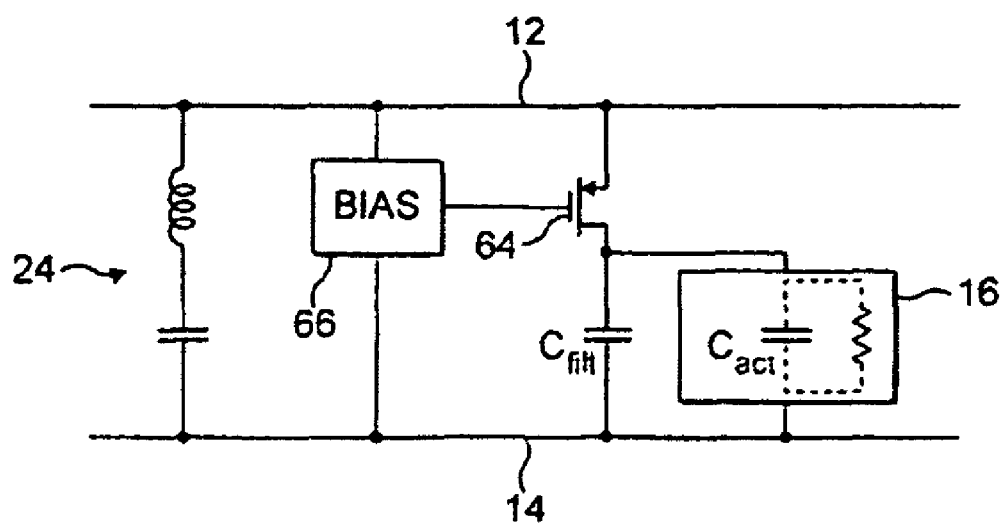
FIG. 9 is a more detailed circuit diagram of one of the RC elements of FIG. 8.

Advantageously the resistance of each resistance-capacitance network is a semiconductor device such as a PMOS transistor biased into its triode region, as shown in FIG. 9. The PMOS transistor has its source connected to the positive supply line 12 and its drain to the associated capacitance C1_INT, C2_INT, C3_INT of the RC network. A biasing circuit 66 performs the required biasing into the triode region. Also visible in FIG. 9 is the circuit unit 16 coupled to, the tap 68 of the resistance-capacitance combination, as well as the component of the capacitance, comprising the capacitance $C_{filt}$ added for filtering purposes and the inherent capacitance $C_{act}$ of the circuit unit 16.

The circuit diagram of FIG. 8 shows two current noise sources. A first noise source 68 represents the injection of noise onto the supply lines externally of the circuit units connected to the resistance-capacitance filtering networks appearing in FIG. 8. The second noise source 70 represents noise generated by the circuit unit connected to the tap of the third resistance-capacitance network $R_{passgate3}$, C3_INT.

Referring to FIG. 9, in operation, when the passgate transistor 64 is ON, It introduces the series resistance $R_{passgate}$ which provides a low-pass frequency response for medium frequency noise. In this situation, current noise signals on the supply lines 12 and 14 are firstly partitioned between the RC branch represented by the FET 64 and its series capacitance represented by $C_{act}+C_{filt}$ on the one hand and the LC notch filter combination 24. Note that at medium frequencies, the LC combination has significant admittance and then its filtering action is not so strong. The noise signal is then partitioned between the actual circuit capacitance $C_{apt}$ and the filtering capacitance $C_{filt}$, the RC branch acting as a potential divider as well. Only the current noise injected in $C_{act}$ is effectively affecting the signal processing unit.

It will be understood that the FET 64 introduces a voltage drop between the positive supply line 12 and the supply connection of the circuit unit 16 to the junction between the FET 64 and the capacitance $C_{filt}$. In practice, this voltage is typically maintained at a value lower than 150 mV. Given this constraint, a typical RC filter of this description exhibits a low-pass cut-off threshold frequency of about 100 MHz. Clearly, higher cut-off frequencies can be achieved with smaller resistance or capacitance values.

In this way, noise present on the supply lines 12 and 14 is rejected by the combination of a voltage regulator (as described above with reference to FIGS. 1, 2 and 3), by notch filters (as described above with reference to FIGS. 2 to 7), and by RC filters (as described above with reference to FIGS. 8 and 9). These filters are operable over different frequency ranges, i.e. the voltage regulator at low frequencies, the RC filter at medium frequencies, and the notch filters at a high frequency.

Use of the RC filter described above has the additional advantage of introducing a second RC filter for the purpose of noise generated by the second noise source 70 (see FIG. 8). Transmission of noise from the second source 70 to the other circuit units via the supply lines 12 and 14 is suppressed by an RC filter formed by the combination of $R_{passgate3}$ and the capacitance of the remainder of the circuitry coupled between the supply lines 12 and 14. Thus, such a noise signal is low-pass filtered with a cut-off frequency given by $1/(2\pi C_{powerline} R_{passgate})$ where $C_{powerline}$ is the overall capacitance between the supply lines 12 and 14.

As a final feature, the use of a semiconductor element for the resistive part of the RC network has the advantage that it can be turned off at power-down, reducing leakage currents to negligible levels.

In sunmmary, in an integrated circuit having a number of circuit units on a single semiconductor chip, particularly in a system-on-chip integrated circuit including an integrated transceiver, interference between the circuit units is suppressed using on-chip resonant elements. Each resonant element has at least one on-chip capacitor and at least one on-chip conductive line constituting an inductance. The capacitance-inductance combinations are arranged to be resonant at one or more frequencies at which radio frequency energy is generated by the circuit units. The capacitive part of each series resonant combination is formed as a plurality of capacitor elements forming in an array to minimize self-inductance. Also disclosed is a filtering arrangement in which each circuit unit is individually supplied from the tap of a series resistive-capacitance combination to provide low-pass filtering. The resistance of such a combination may be configured as an FET to allow the circuit unit to be individually powered down to a low leakage state.

The invention claimed is:

1. An integrated circuit comprising:
a plurality of circuit units on a single semiconductor chip, at least some of the plurality of circuit units being operable at radio frequencies; and
a plurality of resonant elements interconnecting supply lines on the chip, each of the plurality of resonant elements comprising a series combination of at least one on-chip capacitor and at least one on-chip conductive line constituting an inductance, the combination having a series resonance at a frequency at which at least one of the circuit units processes radio frequency signals;
wherein the on-chip capacitor of the series combination of at least one of the plurality of resonant elements comprises a plurality of on-chip capacitors located side-by-side on the chip and connected to each other in parallel; and
wherein interconnections between the plurality of on-chip capacitors forms at least part of the inductance of the on-chip conductive line.

2. The integrated circuit according to claim 1, wherein the parallel on-chip capacitors of the series combination comprise at least four capacitors forming an array having rows and columns, with at least two capacitors in each of the rows and at least two capacitors in each of the columns.

3. The integrated circuit according to claim 1, wherein the inductance of the series combination includes a conductive line connecting the at least one capacitor to one of the supply lines.

4. The integrated circuit according to claim 1, wherein said at least one capacitor of the series combination has a capacitance in the range of from 1 pF to 100 pF.

5. The integrated circuit according to claim 1, wherein
the supply lines are arranged such that a first one of the circuit units receives supply current from one of the supply lines which has a second one of the circuit units connected to it between the first circuit unit and a power source terminal which is for supplying power to the supply line; and wherein
one of the resonant elements is connected to the supply line at a node on that portion of the supply line interconnecting the first and second circuit units, the one resonant element being resonant at a radio frequency of operation of the first or the second circuit unit to act as a guard element suppressing the transmission of radio frequency energy at that radio frequency between the first and second circuit units along the supply line.

6. The integrated circuit according to claim 5, wherein
a third one of the circuit units is connected to the supply line, connections of the circuit units to the supply line being arranged such that both the second and the first units are connected to the supply line between the third unit and the power source terminal; wherein
a second one of the resonant elements is connected to the supply line at the node on that portion of the supply line interconnecting the third unit and the first unit, the second of the resonant elements being resonant at the radio frequency of operation of the first circuit unit or a radio frequency of operation of the third circuit unit to act as a second guard element, which second guard element operates to suppress the transmission of the radio frequency energy at that radio frequency between the first and the third units along the supply line.

7. The integrated circuit according to claim 1, wherein at least one of the plurality of circuit units is coupled to one of the supply lines via a respective on-chip resistive element forming part of an RC network such that the supply current drawn by the at least one of the plurality of circuit units passes through the respective resistive element.

8. The integrated circuit according to claim 7, wherein the on-chip resistive element comprises a field-effect transistor connected so as to be biased into the triode region of operation of the field-effect transistor.

9. An integrated circuit comprising:
at least one circuit unit on a single semiconductor chip, the at least one circuit unit being operable at a radio frequency, wherein
the chip includes a resonant decoupling element interconnecting supply lines on the chip and comprising a series combination of (i) a plurality of on-chip capacitors located side-by-side on the chip and connected in parallel with each other and (ii) an inductance formed by a conductive line on the chip.

10. The integrated circuit according to claim 9, wherein the conductive line includes a lumped inductance.

11. The integrated circuit according to claim 9, wherein the capacitors of the series combination comprise at least two pairs of capacitors stacked on top of each other, the pairs being located side-by-side.

12. The integrated circuit according to claim 9, wherein the plurality of on-chip capacitors comprise at least four capacitors located side-by-side in an array having rows and columns, with at least two capacitors in each of the rows and at least two capacitors in each of the columns.

13. The integrated circuit according to claim 12, wherein inductance formed by conductive lines comprises interconnections between the capacitors to form a grid of inductive lines.

14. The integrated circuit according to claim 13, wherein the resonant frequency of the series combination is at least 1 GHz.

15. An integrated circuit comprising:
a plurality of circuit units on a single semiconductor chip, at least some of which units are operable at radio frequencies;
a supply line for supplying power to the plurality of circuit units, wherein at least a first one of the circuit units is operated so as to emit radio frequency energy and is coupled to the supply line via a respective on-chip resistive element forming part of an RC network such that supply current drawn by the first one of the circuit units passes through the resistive element, and wherein
the supply line itself, together with circuitry other than the first one of the circuit units coupled to the supply line, has an associated capacitance forming part of the RC network to define a low-pass filter having a cut-off frequency above the frequency at which the first one of the circuit units chiefly emits radio frequency energy so as to isolate the circuitry coupled to the supply line from the first one of the circuit units.

16. The integrated circuit according to claim 15, wherein the resistive element comprises a field-effect transistor connected so as to be biased into a triode region of operation of the field-effect transistor.

17. The integrated circuit according to claim 16, wherein the field-effect transistor is a PMOS device.

18. An integrated circuit comprising:
a plurality of circuit units, on a single semiconductor chip, at least some of the plurality of circuit units being operative at at least one radio frequency and being coupled to a supply line, wherein the chip includes (i) coupled to the supply line, at least one resonant element comprising a series combination of an inductance and a capacitance having a series resonant frequency corresponding to a frequency of operation of at least one of the plurality of circuit units that operate at the at least one radio frequency, (ii) at least one RC network including a resistive element connected in series between the supply line and a respective said circuit unit, and (iii) a supply line voltage regulator.

19. An integrated circuit according to claim 18, further comprising an integrated transceiver.

\* \* \* \* \*